United States Patent

Yoshimoto

Patent Number: 6,067,274
Date of Patent: May 23, 2000

[54] SEMICONDUCTOR MEMORY DEVICE HAVING A BURST MODE

[75] Inventor: Takahiko Yoshimoto, Yamatotakada, Japan

[73] Assignee: Sharp Kabushiki Kaisha, Japan

[21] Appl. No.: 09/190,845

[22] Filed: Nov. 12, 1998

[30] Foreign Application Priority Data

Nov. 14, 1997 [JP] Japan ..................................... 9-313965

[51] Int. Cl.[7] ....................................................... G11C 8/00
[52] U.S. Cl. ................................ 365/238.5; 365/189.02; 365/203
[58] Field of Search ............................... 365/238.5, 239, 365/230.03, 203, 189.02, 230.02

[56] References Cited

U.S. PATENT DOCUMENTS

| | | | |
|---|---|---|---|
| 5,357,477 | 10/1994 | Matsumoto et al. ............... | 365/230.02 |
| 5,703,828 | 12/1997 | Park et al. ........................ | 365/230.03 |
| 5,748,561 | 5/1998 | Hotta ................................ | 365/238.5 |
| 5,751,657 | 5/1998 | Hotta ................................ | 365/238.5 |

*Primary Examiner*—Son Mai
*Attorney, Agent, or Firm*—Morrison & Foerster LLP

[57] ABSTRACT

A semiconductor memory device includes: a memory cell array including a plurality of memory cells arranged in a matrix of rows and columns; and a row selector for selecting one of the rows of the memory cell array in accordance with an input address signal, the semiconductor memory device having a burst mode for sequentially accessing one row of memory cells. The memory cell array includes a plurality of groups each including at least one column of memory cells, and wherein the semiconductor memory device further includes: a column selector for simultaneously selecting all of the columns in each group in accordance with the input address signal; and at least two precharge circuits for precharging bit lines associated with the columns in each group selected by the column selector.

6 Claims, 12 Drawing Sheets

"1" = High level
"0" = Low level

▨ Being amplified by sense amplifier

▩ Having been sensed and being output as Dout

PRIOR ART

SEMICONDUCTOR MEMORY DEVICE HAVING A BURST MODE

BACKGROUND OF THE INVENTION

1. Field of the Invention

The present invention relates to a semiconductor memory device having a high-speed reading mode, called a burst mode. In particular, the present invention relates to a semiconductor memory device capable of successively reading data in a burst mode operation while avoiding increase in the chip area.

2. Description of the Related Art

Due to the development of high-speed microprocessors (MPUs) in recent years, there have been increasing demands for semiconductor memory devices capable of high-speed access.

One answer to such demands has been to increase the speed of the usual random access method; another has been to develop semiconductor memory devices having a burst mode, which provides for very fast reading at the expense of some limitation on the access method.

A read operation in the burst mode is achieved by simultaneously selecting a plurality of memory cells in a memory cell array corresponding to a row address designated by input address signals, and rapidly switching the column address so as to sequentially output the data stored in the respective memory cells.

FIG. 5 shows an example of a conventional semiconductor memory 1000 having a burst mode. FIG. 6 is a circuit diagram showing a Y-decoder/selector 1023, precharge circuits 1024, and a burst mode selector 1032. FIG. 7 is a timing diagram illustrating a high-speed read operation in the burst mode.

Hereinafter, any reference to a "memory" will be directed to a "semiconductor memory" unless otherwise specified.

The memory 1000 shown in FIG. 5 receives address signals A0 to A19, among which A0 to A6 designated a column address, and A7 to A19 designate a row address.

The memory 1000 includes a memory cell array 1010 in which memory cells M0i0, M0i1, . . . etc. (hereinafter collectively referred to as "memory cells M") each for storing 1-bit data are arranged in a matrix. The memory 1000 also includes a row selector for selecting the memory cells M corresponding to a row address designated by A7 to A19.

The row selector includes an input buffer circuit 11 for receiving the row address designated by A7 to A19, a predecoder (A) circuit 1012 for receiving the output therefrom, and an X-decoder 1013 for selecting a row WLi (the word lines WLi in FIG. 6, where i is one of 0, 1, 2, . . . , and i) of the memory cell array 1010 in accordance with a predecode output from the predecoder (A) circuit 1012.

In addition, the memory 1000 includes a column selector for selecting a plurality of columns of memory cells respectively corresponding to a column address designated by A0 to A6. The column selector includes an input buffer circuit 1021 for receiving a column address designated by A3 to A6, a predecoder (B) circuit 1022 for receiving the output therefrom, a Y-decoder/selector 1023 for receiving predecode outputs CA0 to CA7, and CB0 to CB3 from the predecoder (B) circuit 1022, an input buffer circuit 1030 for receiving the address signals A0 to A2, a burst mode decoder circuit 1031 for receiving the output therefrom, and a burst mode selector 1032 for receiving the outputs BS0 to BS7 from the burst mode decoder 1031.

To the Y-decoder/selector 1023 is coupled the precharge circuits 1024 for precharging common bit lines CBIT0 to CBIT7 (hereinafter collectively referred to as "common bit lines CBIT") designated by the column addresses. The common bit lines CBIT are coupled to sense amplifiers (not shown) in a read circuit 1033. An output circuit 1020 is coupled to the read circuit 1033. The output circuit 1020 outputs the output Dout of the read circuit 1033 to an output terminal 2.

Next, the high-speed read operation of the memory 1000 having the above structure in the burst mode will be described. First, the row address signals A7 to A19 are input to the predecoder (A) circuit 1012 via the input buffer circuit 1011 and decoded by the predecoder (A) circuit 1012 and the X-decoder 1013, so that one of the word lines WLi goes active (i.e., the "High" level) with the timing shown in FIG. 7.

The column address signals A3 to A6 are input to the input buffer circuit 1021, and the output thereof is decoded by the predecoder (B) circuit 1022, so that the predecode outputs CA0 to CA7 and CB0 to CB3 are applied to the Y-decoder/selector 1023. The Y-decoder/selector 1023 selectively couples to the respective common bit line each of the memory cells that are coupled to the word lines WLi. Then, the precharge circuits 1024 performs a precharge for each common bit line CBIT coupled to the respective memory cells for a predetermined period of time. After the precharge is completed, the potential of the common bit line CBIT is amplified by a sense amplifier in the read circuit 1033, and the output circuit 1020 causes the output Dout of the read circuit 1033 to be output to the output terminal 1002 with the timing illustrated in FIG. 7.

In the above-described conventional memory having a burst mode, a higher speed data reading can be achieved by precharging at a predetermined potential the common bit lines CBIT associated with a block to be read next. A conventional example of adopting this technique is disclosed, for example, in Japanese Laid-open Publication Nos. 61-271683 and 1-137491.

The structure and operation of such a memory will be described with reference to FIGS. 8 and 9. FIG. 8 is a block diagram showing the memory. FIG. 9 is a timing diagram illustrating the operation of the memory.

As shown in FIG. 8, the memory includes a write circuit 1020, a write address pointer 1021, a read circuit 1040, a read address pointer 1031, and memory cells MCmn.

Next, the operation of the memory will be described with reference to FIG. 9. As shown, the precharge signal PRC goes "High" prior to a read cycle RC0 for reading data from the memory cell MCmn, and all the bit lines RBL0 to RBL7 dedicated to reading are precharged at the "High" level.

Hereinafter, a bit line dedicated to reading, a word line dedicated to reading, etc. will be referred to "a read bit line", "a read word line", etc.

Next, after the rise of the read clock signal RCK, the precharge signal PRC goes "Low", and the precharging for all of the read bit lines RBL0 to RBL7 is completed.

Furthermore, in response to the precharge signal PRC going "Low", the signal on the selected read word lines RWLn rises. As a result, the data stored in the memory cell MCmn coupled to the selected read word lines RWLn carrying the signal which has risen is output to the read bit line RBLm. Then, one of the eight read bit lines RBL0 to RBL7 is selected by a read bit line selection signal REB (see FIG. 8), and the potential of the selected bit line RBLm is detected and amplified by a sense amplifier in a read circuit 1040 and thereafter output as data Dout.

Before the occurrence of the next read cycle RC1, the read word line RWLn is lowered to the "Low" level by a sense complete signal or the like. Thereafter, the precharge signal PRC is raised in order to read data from the memory cell MCm+1n coupled to the next read bit line RBLm+1, thereby beginning a precharge for all of the read bit lines RBL0 to RBL7.

Another conventional memory capable of yet higher-speed reading is disclosed in Japanese Laid-open Publication No. 8-63990 filed by the Applicant. In accordance with this memory, the sense amplifier section of the read circuit is multiple divided so as to enable successive reading of page data, thereby achieving high-speed reading without a time lag during page switching.

The structure and operation of this memory will be described with reference to FIGS. 10 to 12. FIG. 10 is a block diagram illustrating the structure of the memory. FIG. 11 is a specific circuit diagram thereof. FIG. 12 is a timing diagram illustrating the operation thereof. Since the circuit structure of this memory is similar to that of the memory shown in FIG. 5, the corresponding components are denoted by the same reference numerals as used in FIG. 5.

In this memory, the column selector includes an input buffer circuit 1021, a predecoder (B) circuit 1022, and a Y-decoder/selector 1123. As shown in FIG. 12, a plurality of rows in the memory cell array 1010 corresponding to the column addresses designated by the input address signals are selected along with a plurality of columns other than the relevant column addresses. As a result, 2 pages of page data including the page data corresponding to the column addresses designated by the input address signals can be simultaneously read into a sense amplifier section (sense amplifier (0) circuits 1224a, and sense amplifier (1) circuits 1224b).

Accordingly, at time t5, where the reading of the page data of the address designated by the input address signals is complete and the reading of the page data of the next address begins, the page data of the next address has advantageously been read into the sense amplifier section.

Therefore, in accordance with this memory, the high-speed reading operation from the sense amplifier is not disrupted by the page switching for successively reading the page data. As a result, a continuous high-speed read can be realized.

However, in accordance with the conventional memory having a burst mode disclosed in Japanese Laid-open Publication Nos. 61-271683 and 1-137491, all of the selected common bit lines CBIT are precharged, thereby resulting in relatively high power consumption.

In addition, the recent trend in response to the gradual increase in memory capacity has been to increase the capacitance of the common bit lines CBIT (which need to be precharged as mentioned above). Therefore, the precharge time required for precharging the common bit lines CBIT has become long relative to the sensing time required by the sense amplifiers. The increased precharge time for the common bit lines CBIT inevitably results in a long cycle time required for one read cycle, which has presented certain constraints to increasing the read speed of such memories.

The memory having a burst mode disclosed Japanese Laid-open Publication No. 8-63990 requires at least twice as many sense amplifiers as the number of pages of data. Since all of the sense amplifiers are operating during a burst mode operation, relatively high power is consumed. Moreover, such a large number of sense amplifiers leads to an increased chip size.

The above problems will be described in more detail with reference to FIGS. 11 and 13. In this memory, as shown in FIG. 11, eight common bit lines CBIT (CBITA0 to CBITA3, CBITB0 to CBITB3) are always precharged at the time of random access and the first access in a burst mode. In the second and subsequent accesses in the burst mode, too, the eight common bit lines CBIT are always precharged.

The precharging function is performed by the precharge transistors (p-channel MOS transistors) 1050 shown in FIGS. 11 and 13. Firstly, since it is impossible to employ transistors having high driving ability for the precharge transistors 1050, the precharge time is inevitably prolonged.

Secondly, high power is consumed because the eight common bit lines CBIT are always precharged at Vcc.

Thirdly, since a sense amplifier SA is required for every common bit line CBIT, the total area occupied by the sense amplifiers SA per unit chip area becomes large, resulting in an increase in the chip size.

Fourthly, such large sense amplifier area in itself increases power consumption.

SUMMARY OF THE INVENTION

A semiconductor memory device according to the present invention includes: a memory cell array including a plurality of memory cells arranged in a matrix of rows and columns; and a row selector for selecting one of the rows of the memory cell array in accordance with an input address signal, the semiconductor memory device having a burst mode for sequentially accessing one row of memory cells, wherein the memory cell array includes a plurality of groups each including at least one column of memory cells, and wherein the semiconductor memory device further includes: a column selector for simultaneously selecting all of the columns in each group in accordance with the input address signal; and at least two precharge circuits for precharging bit lines associated with the columns in each group selected by the column selector.

In one embodiment of the invention, the column selector simultaneously selects at least two groups of columns of memory cells to be accessed one after another, and, when access to an earlier one of the at least two groups begins, begins precharging bit lines associated with the columns of memory cells of a subsequent one of the at least two groups.

In another embodiment of the invention, when access to a first one of the plurality of groups is completed, a subsequent one of the plurality of groups to be accessed is selected.

In still another embodiment of the invention, a period for reading each group of columns of memory cells is prescribed to be shorter than a period for precharging the bit lines.

Alternatively, the semiconductor memory device according to the present invention includes: a memory cell array including a plurality of memory cells arranged in a matrix of rows and columns; and a row selector for selecting one of the rows of the memory cell array in accordance with an input address signal, the semiconductor memory device having a burst mode for sequentially accessing one row of memory cells, wherein the memory cell array includes a plurality of groups each including at least one column of memory cells, the semiconductor memory device further including: a selector for selecting at least two of the plurality of groups in accordance with the input address signal; a precharging circuit for precharging bit lines associated with all of the columns in the at least two groups selected by the column selector; and an access circuit for accessing the at least two groups selected by the column selector and precharged by the precharging circuit, and wherein, when the access circuit begins access to one of the at least two groups, the selector selects a next one of the at least two groups.

In one embodiment of the invention, the access circuit begins the access to the one of the at least two groups, the precharging circuit begins precharging all bit lines associated with the next one of the at least two groups.

In another embodiment of the invention, a period for accessing each group of columns of memory cells by the access circuit is prescribed to be shorter than a period for precharging all bit lines associated with each group of columns of memory cells.

As described above, in accordance with the semiconductor memory device of the p)resent invention, a column selector is configured so as to select a plurality of columns of memory cells in a memory cell array corresponding to column addresses designated by input address signals as well as a plurality of columns of memory cells corresponding to at least one column address other than the designated column addresses. As a result, in addition to reading the burst data corresponding to the column addresses designated by the input address signals, the burst data corresponding to the column addresses to be next selected can also be read and transferred to immediately before the selector.

As a result, when sequentially outputting burst data of the same row address, it is possible to perform a continuous high-speed read operation for a sense amplifier section without disruption. Thus, a higher-speed read operation can be provided than is possible with the aforementioned conventional examples.

The column selector may be any circuit capable of selecting a plurality of columns in the memory cell array corresponding to the column addresses designated by input address signals as well as a plurality of columns of memory cells corresponding to at least one column address other than the designated column addresses. For example, such a circuit can be realized by additionally incorporating a logic circuit (e.g., a NAND circuit) for each plurality of columns to be designated by column addresses in a usual column selector circuit.

Thus, the invention described herein makes possible the advantages of (1) providing a semiconductor memory device capable of operating with a shorter cycle time, thereby enabling faster data reading than is possible with conventional semiconductor memory devices; and (2) providing a semiconductor memory device capable of operating with relatively low power consumption.

These and other advantages of the present invention will become apparent to those skilled in the art upon reading and understanding the following detailed description with reference to the accompanying figures.

DESCRIPTION OF THE PREFERRED EMBODIMENTS

Hereinafter, an example of the present invention will be described with reference to the accompanying figures.

Figure 1:
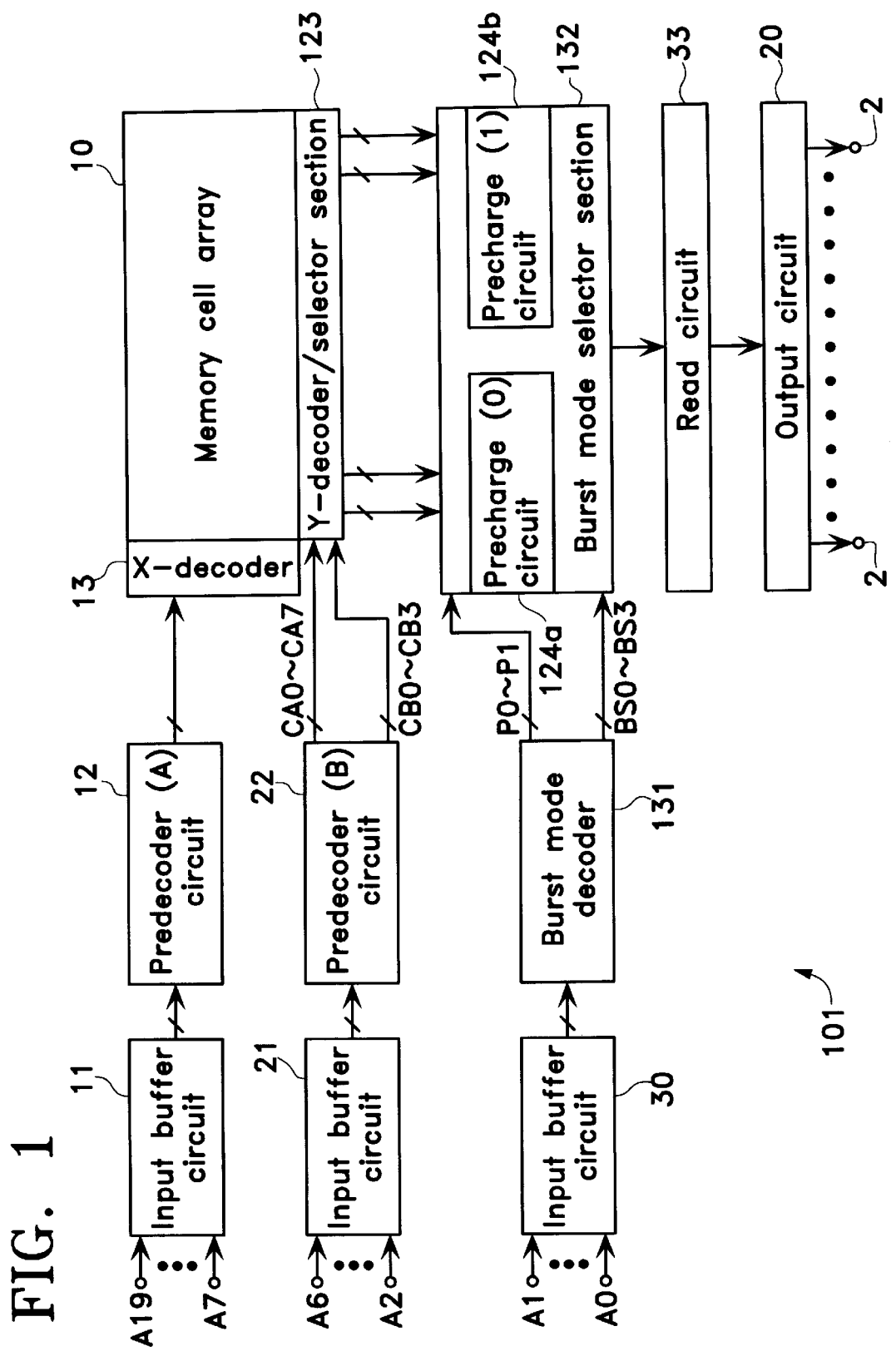
FIG. 1 is a block diagram illustrating the structure of a semiconductor memory device according to the present invention.
Figure 2:
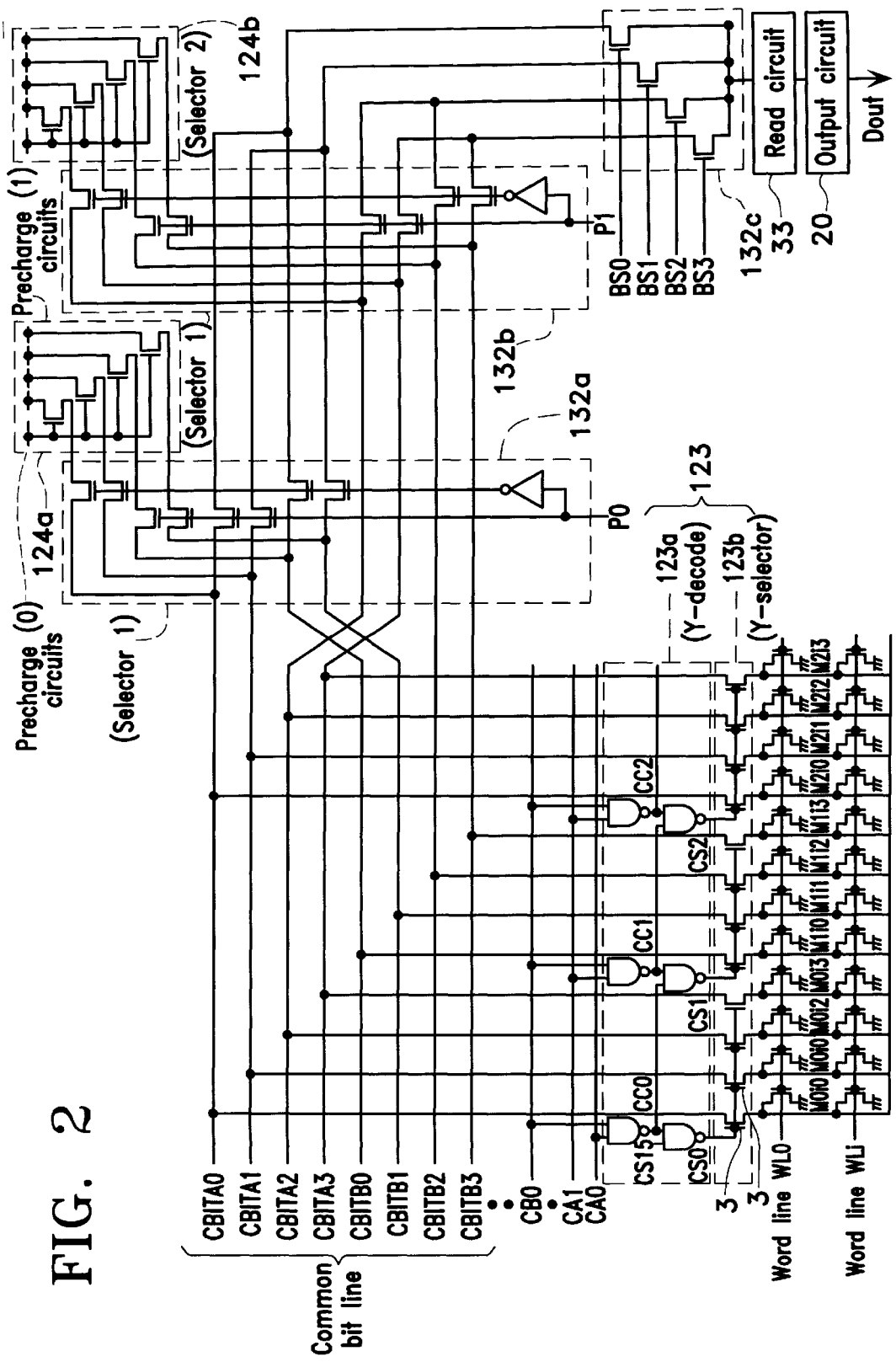
FIG. 2 is a circuit diagram illustrating the detailed structure of a Y-decoder/selector section, a precharge section, and a selector section in the semiconductor memory device shown in FIG. 1.
Figure 3:
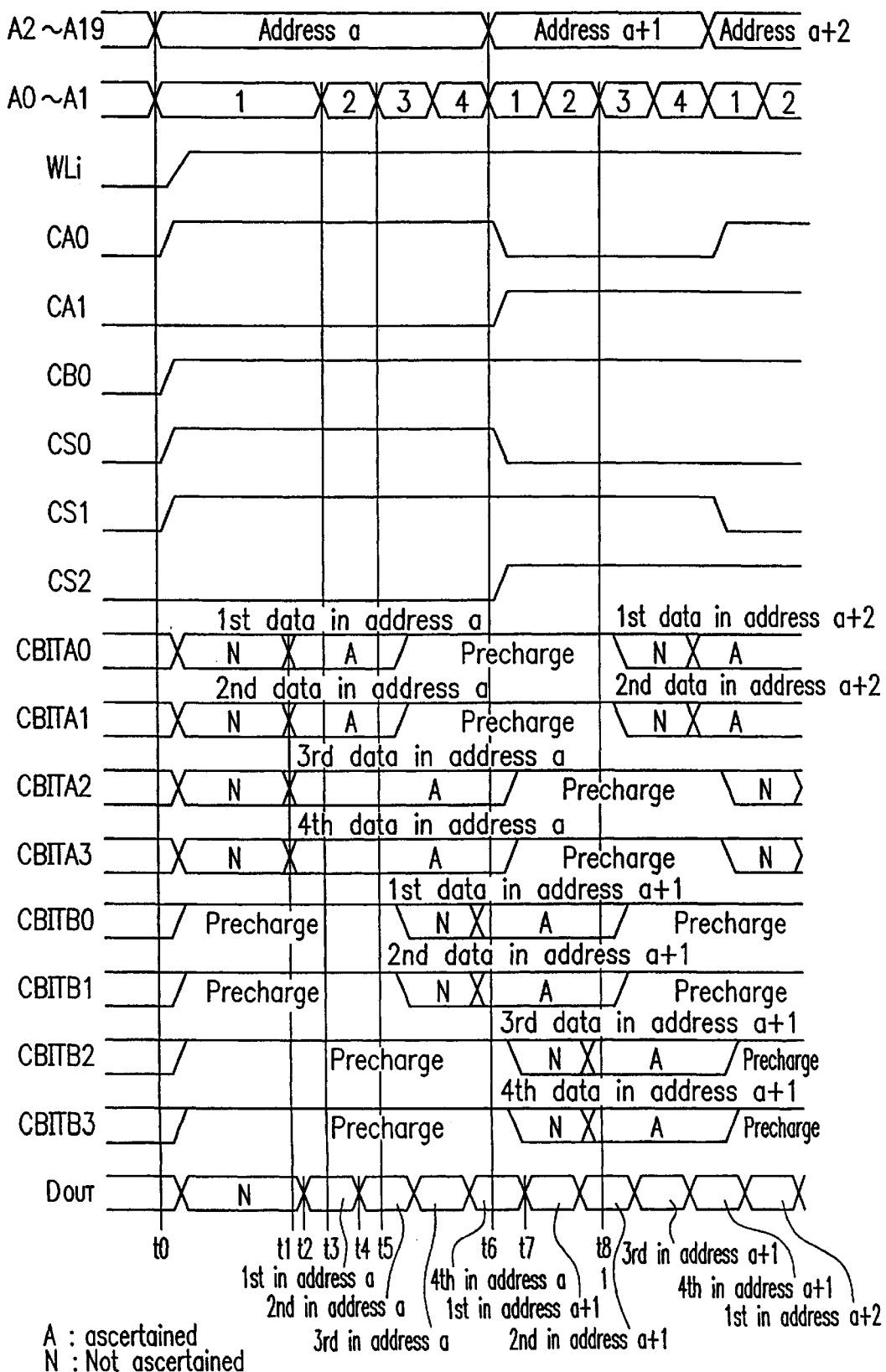
FIG. 3 is a timing diagram illustrating a high-speed read operation in a burst mode of the semiconductor memory device according to the present invention.
Figure 4:
FIG. 4 is an operation chart describing the operation of a burst mode selector.
Figure 4:
Figure 5:
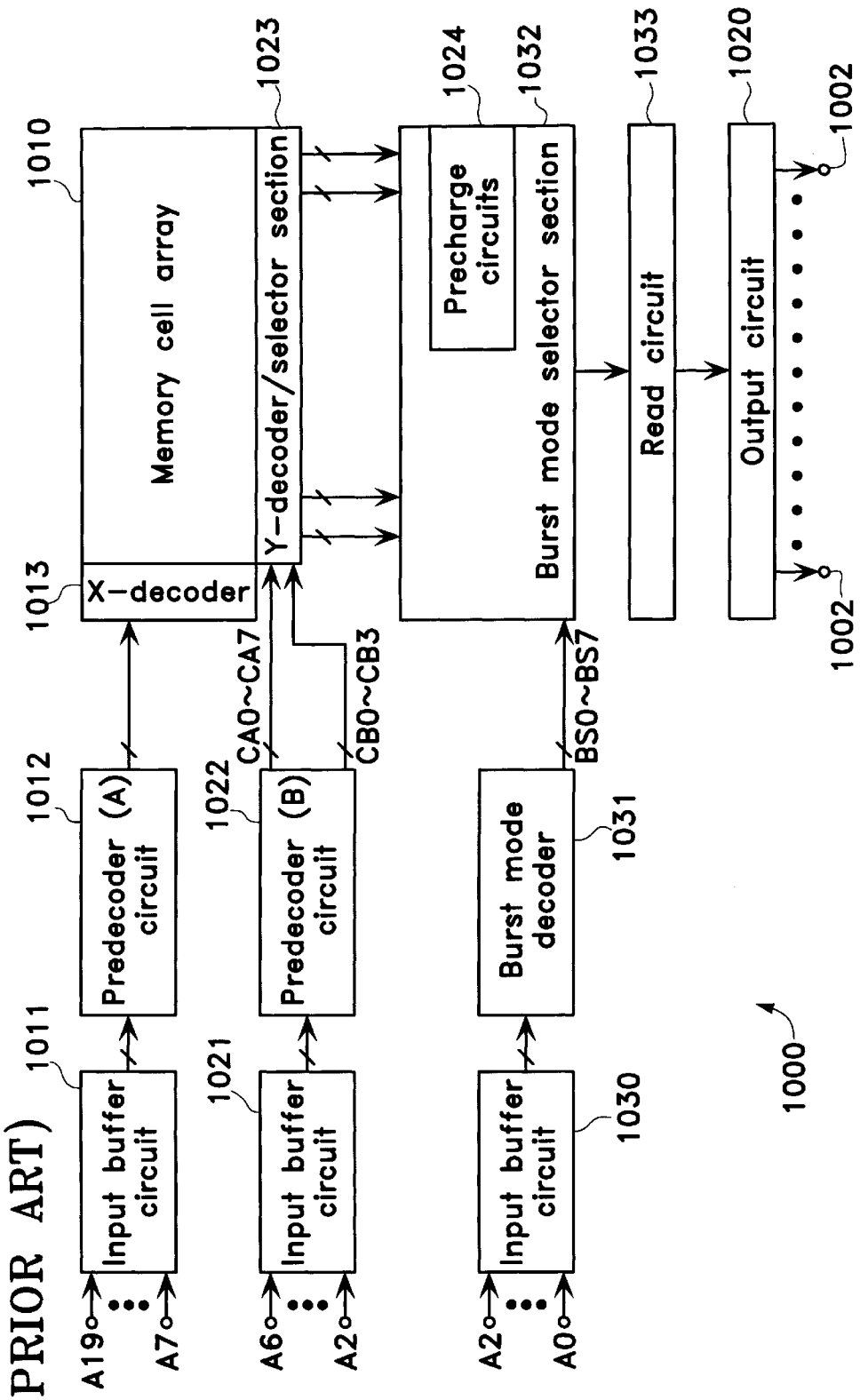
FIG. 5 is a block diagram illustrating the structure of a conventional semiconductor memory device having a burst mode.
Figure 6:
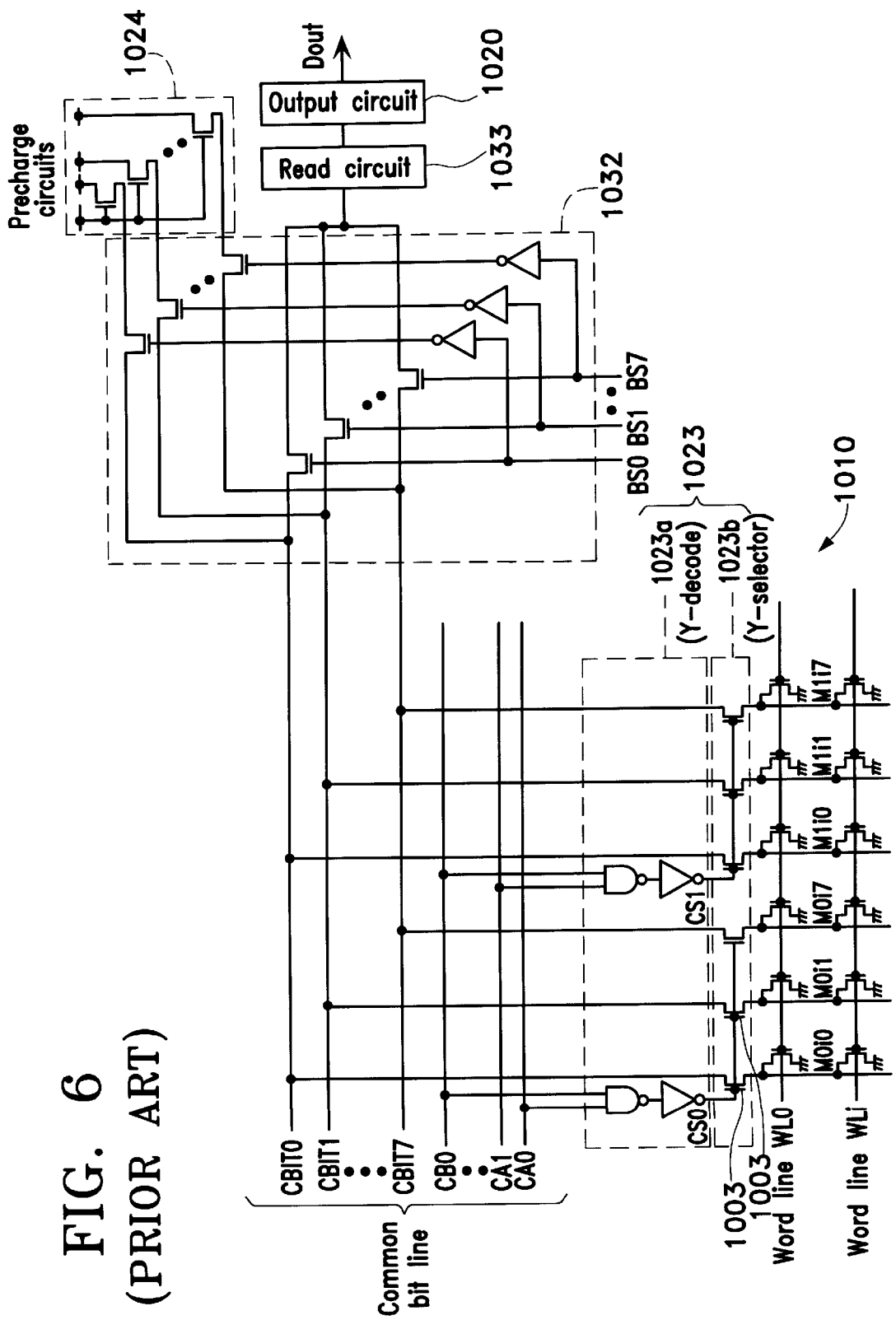
FIG. 6 is a circuit diagram illustrating the detailed structure of a Y-decoder/selector section, a precharge section, and a selector section in the semiconductor memory device shown in FIG. 5.
Figure 7:
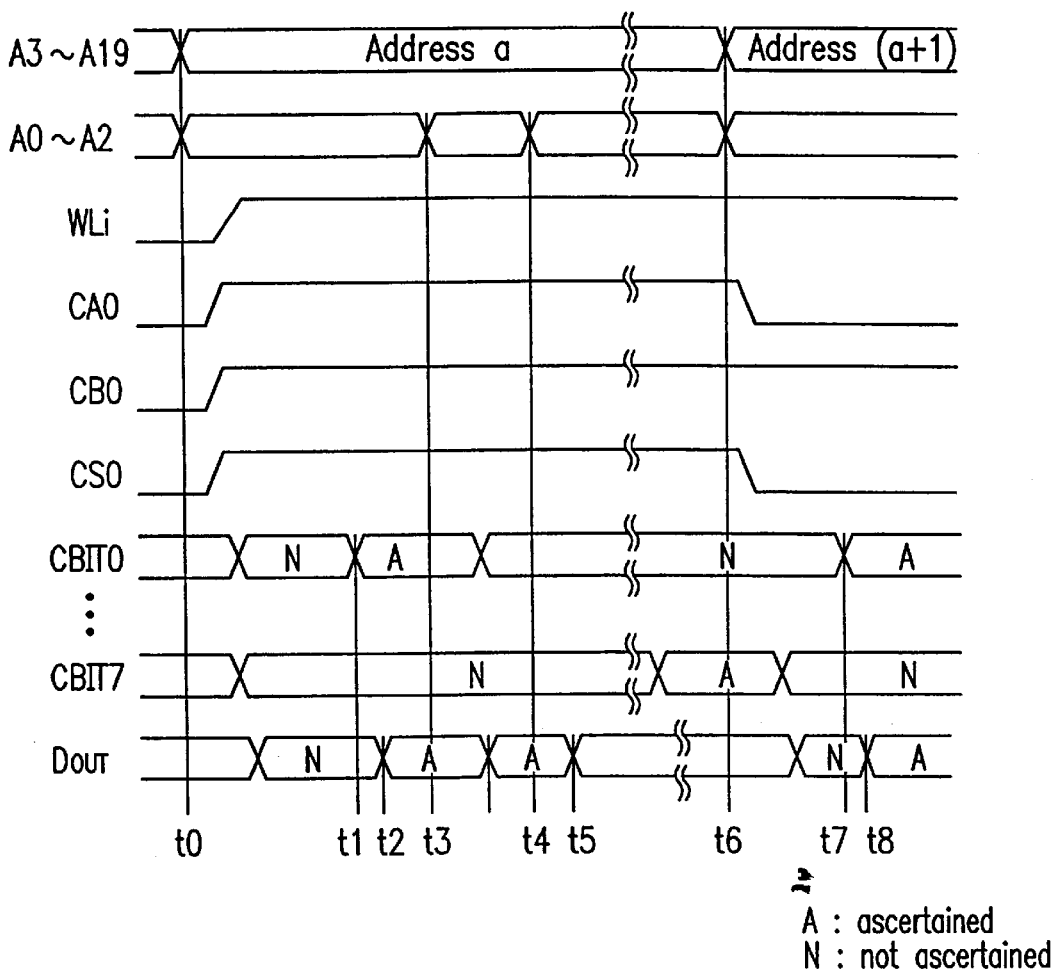
FIG. 7 is a timing diagram illustrating a high-speed read operation in a burst mode of the semiconductor memory device shown in FIG. 5.
Figure 8:
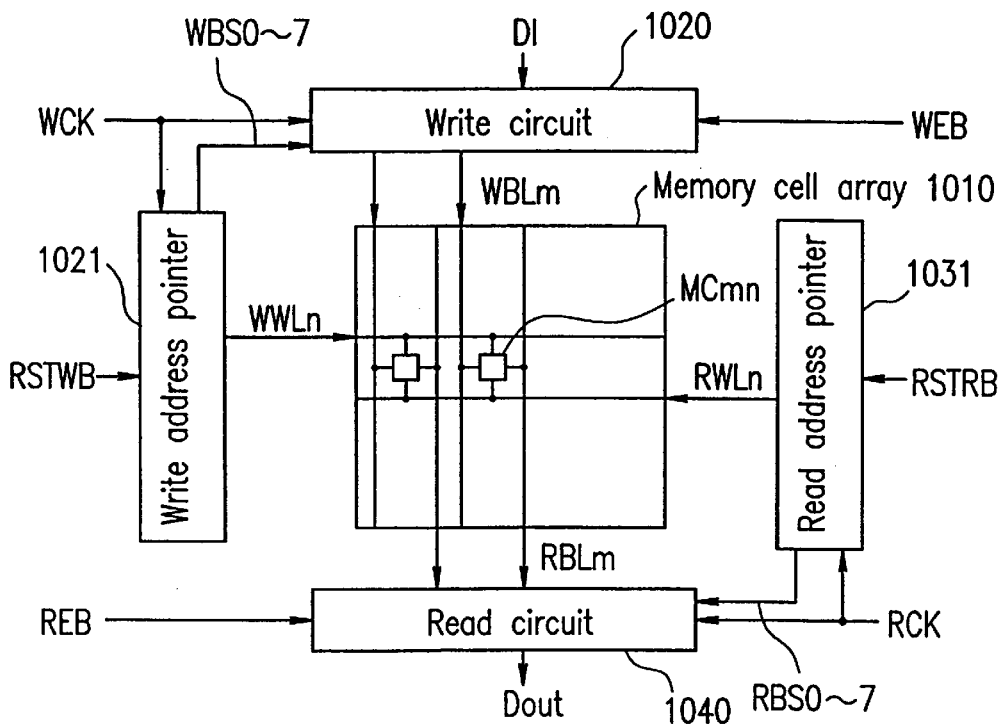
FIG. 8 is a block diagram illustrating a portion of a semiconductor memory device having a burst mode, disclosed in Japanese Laid-open Publication Nos. 61-271683 and 1-137491, etc.
Figure 9:
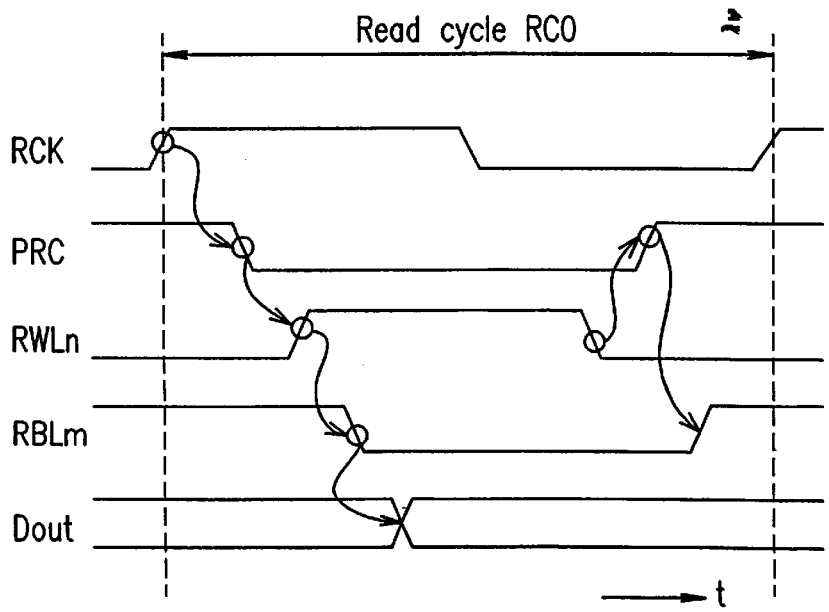
FIG. 9 is a timing diagram illustrating the operation of the semiconductor memory device shown in FIG. 8.
Figure 10:
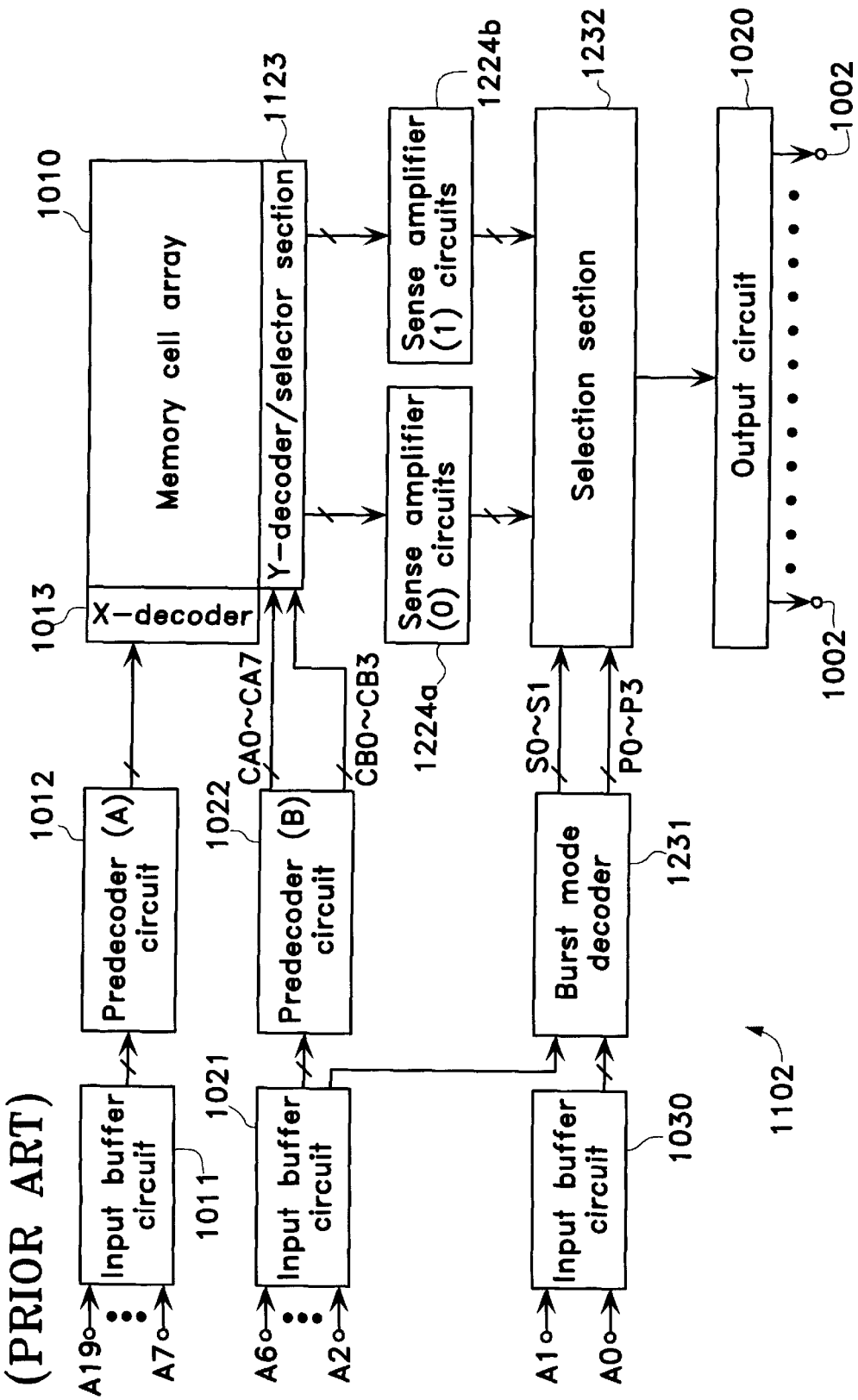
FIG. 10 is a block diagram illustrating a semiconductor memory device having a page mode, disclosed in Japanese Laid-open Publication No. 8-63990.
Figure 11:
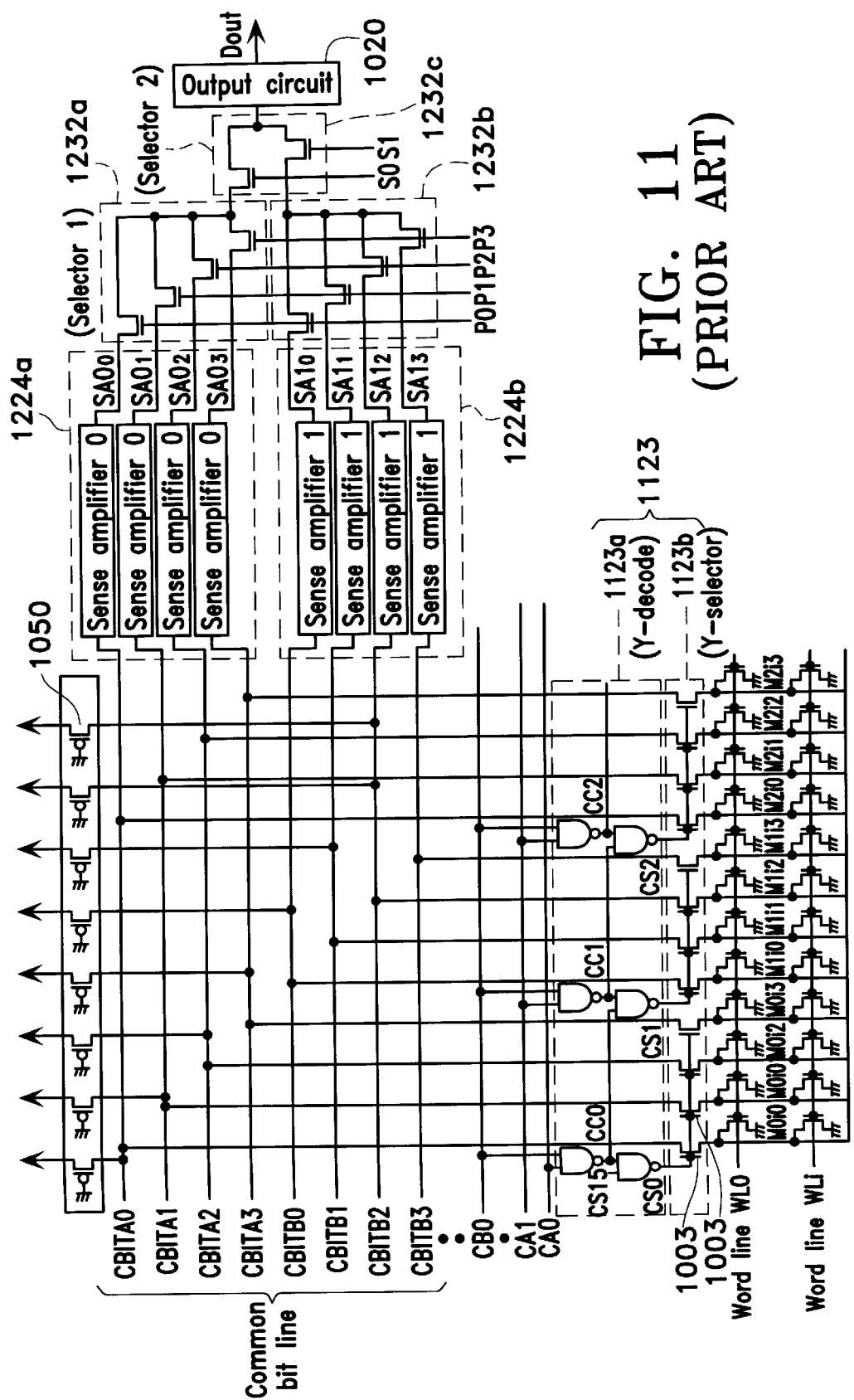
FIG. 11 is a circuit diagram illustrating the detailed structure of a Y-decoder/selector section, a precharge section, and a selector section in the semiconductor memory device shown in FIG. 10.
Figure 12:
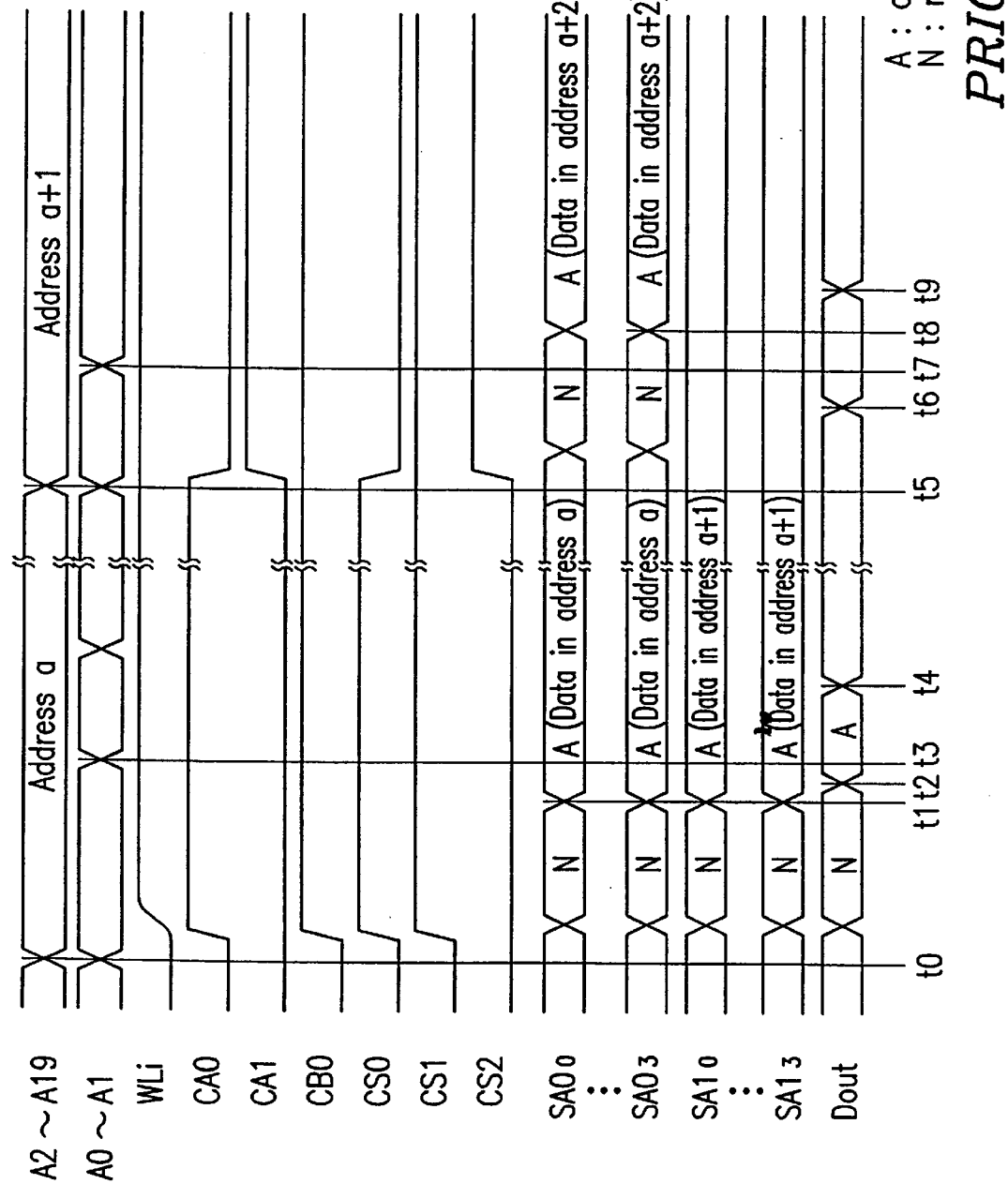
FIG. 12 is a timing diagram illustrating a high-speed read operation in a burst mode of the semiconductor memory device shown in FIG. 10.
Figure 13:
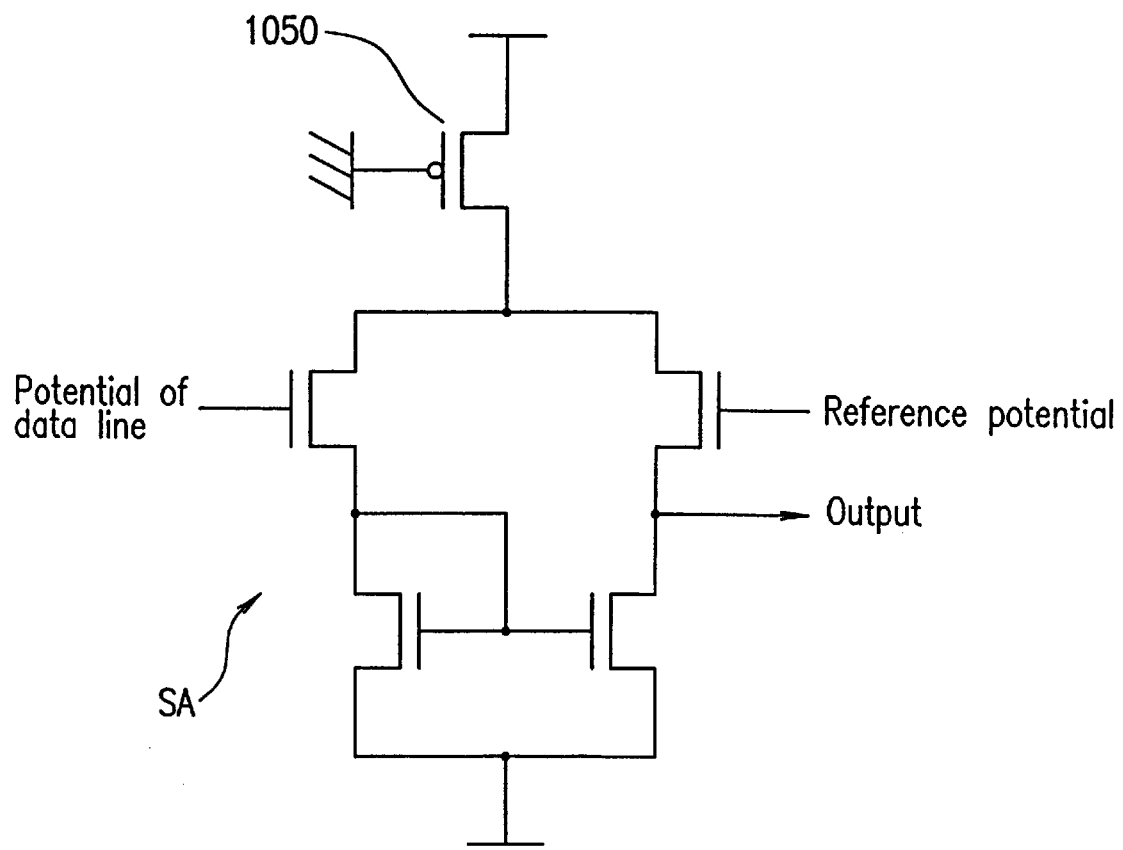
FIG. 13 is a diagram describing the problems associated with the semiconductor memory device shown in FIG. 10.

FIGS. 1 to 4 illustrate one embodiment of the semiconductor memory device according to the present invention. FIG. 1 shows the system structure of the non-volatile memory device (hereinafter, any reference to a "memory" will be directed to a "non-volatile semiconductor memory device" unless otherwise specified) having a burst mode according to the present invention. FIG. 2 is a circuit diagram illustrating the detailed structure of the memory. FIG. 3 is a timing diagram illustrating a read operation of the memory. FIG. 4 is an operation chart describing the operation of a burst mode selector.

As shown in FIGS. 1 and 2, the memory 101 having a burst mode according to the present example includes a memory cell array 10 in which memory cells M0i0, M0i1, ...etc. (hereinafter collectively referred to as "memory cells M") each for storing 1-bit data are arranged in a matrix.

The memory 101 also includes a row selector for selecting the memory cells M corresponding to a row address designated by A7 to A19. The row selector includes an input buffer circuit 11 for receiving the row address designated by A7 to A19, a predecoder (A) circuit 12 coupled to the input buffer circuit 11 for receiving the output therefrom, and an X-decoder 13 for selecting a row WLi (the word lines WLi in FIG. 2, where i is one of 0, 1, 2, ..., and i) of the memory cell array 10 in accordance with a predecode output from the predecoder (A) circuit 12.

In addition, the memory 101 includes a column selector for selecting a plurality of rows of memory cells M corresponding to a column address designated by A0 to A6. The column selector includes an input buffer circuit 21 for receiving the column address designated by A2 to A6, a predecoder (B) circuit 22 coupled to the input buffer circuit 21 for receiving the output therefrom, a Y-decoder/selector 123 for receiving predecode outputs CA0 to CA7, and CB0 to CB3 from the predecoder (B) circuit 22, an input buffer circuit 30 for receiving the column address signals A0 and A1, a burst mode decoder circuit 131 coupled to the input buffer circuit 30 for receiving the output therefrom, and a burst mode selector section 132 for receiving the outputs BS0 to BS3, as well as P0 and P1, from the burst mode decoder 131.

To the Y-decoder/selector 123, common bit lines CBITA0, CBITA1, . . . , etc. (hereinafter collectively referred to as "common bit lines CBIT") shown in FIG. 2 are coupled. To the common bit lines CBIT, precharge (0) circuits 124a and precharge (1) circuits 124b for alternately precharging common bit lines CBIT via the burst mode selector section 132. The common bit lines CBIT are further coupled to a read circuit 33 including sense amplifiers (not shown) for detecting and amplifying the bit line potentials.

An output circuit 20 is coupled to the read circuit 33. The output circuit 20 outputs the output Dout of the read circuit 33 to an output terminal 2.

Next, the operation of the memory 101 having the above structure will be described with reference to FIG. 3. First, the address signals A0 to A19 are input to the memory 101 at time t0. In this case, the memory cell 101 enters a usual random access mode.

More specifically, the row address signals A7 to A19 are first input to the predecoder (A) circuit 12 via the input buffer circuit 11 and decoded by the predecoder (A) circuit 12 and the X-decoder 13, so that one of the word lines WLi goes active (i.e., the "High" level).

In accordance with the column address signals A2 to A6, one of the output signals CA0 to CA7 and one of the output signals CB0 to CB3 from the predecoder (B) circuit 23 go active (i.e., the "High" level). For example, the address signals A2 to A6 designate an address a in the memory, at which time the predecode output signals CA0 and CB0 go active (i.e., the "High" level) and an NAND output CCo thereof (FIG. 2) goes active (i.e., the "Low" level).

As a result, as shown in FIG. 3, the output signal CS0 of the Y-decoder circuit 123a (FIG. 2) goes active (i.e., the "High" level), and the output signal CS1 corresponding to the next column address a+1 also goes active (i.e., the "High" level). Consequently, column selection MOS transistors 3 (FIG. 2) which receive the Y-decode outputs CS0 and CS1 are turned on.

Thus, the memory cells M0i0, . . . , M0i3 and M1i0, . . . , M1i3, which are coupled to the column selection MOS transistor 3, are selected so that it becomes possible to read the data stored in each memory cell M via the common bit lines CBITA0, . . . , CBITA3, and CBITB0, . . . , CBITB3 by means of the column selection MOS transistors 3 in the Y-selector 123b.

At the same time, in accordance with the address signals A0 to A2, the burst mode selector section 132 makes-a selection of whether to precharge the common bit lines CBIT by means of the precharge (0) circuits 124a and the precharge (1) circuits 124b or read the data stored in the respective memory cells M.

For example, if all of the address signals A0 to A2 shift to the "Low" level, as seen from FIG. 4 (which is an operation chart describing the operation of the burst mode selector), the data stored in the memory cells M0i0 to M0i3 is read and transferred to the selector 132c in the burst mode selector section 132, and the common bit lines CBITB0 to CBITB3 are precharged by the precharge (0) circuits 124a and the precharge (1) circuits 124b.

As shown in FIG. 3, the data on the common bit lines CBITA0 to CBITA3 (the outputs from the selectors 132a and 132b) are ascertained (i.e., sense amplified), and thus the read operation (up to the selector 132c) for the burst data in the address a designated by the address signals A2 to A19 is completed. At this time, the precharging of the common bit lines CBITB0 to CBITB3 coupled to the memory cells M1i0 to M1i3, storing the burst data in the next address a+1, is completed Furthermore, in accordance with the address signals A0 and A1, the output signal BS0 from the burst mode decoder circuit 131 goes active (i.e., the "High" level). As a result, the data on the common bit line CBITA0 is amplified by a sense amplifier in the read circuit 33, and output at the output terminal 2 as an output Dout of the output circuit 20 at time t2.

Between time t3 and time t6, address signals A0 and A1 are incremented by 1, and the output signal BS1 to BS3 from the burst mode decoder circuit 131 are sequentially activated. Thus, the data on the common bit lines CBIT (A1 to A3) are sequentially selected, amplified by sense amplifiers in the read circuit 33, and output at the output terminal 2 as the output Dout of the output circuit 20.

The changes in the address signals A0 and A1 occurring at time t3 will be reflected at the output terminal 2 at time t4. In other words, the random access mode is switched to a burst mode in a time period (t4–t3).

At time t5 (at which the address signals A0 and A1 shift to the "Low" level and the "High" level, respectively), the output signal P0 of the burst mode decoder circuit 131 shifts to the "Low" level, and the precharge (0) circuits 124a begin precharging the common bit lines CBITA0 and CBITA1 which have been read. Moreover, an operation begins to read the data on the common bit lines CBITB0 and CBITB1, which have already been precharged, to immediately before the selector 132c.

With reference to FIG. 3, as the address signals A2 to A19 transit to the next address a+1, the predecode output CA0 of the predecoder circuit (B) 22 shifts from the active state (i.e., "High" level) to the inactive state (i.e., "Low" level). Moreover, the predecode output CA1 shifts from the inactive state (i.e., "Low" level) to the active state (i.e., "High" level). The predecode output CB0 remains active (i.e., "High" level). As a result, the NAND output CC0 becomes inactive (i.e., "High" level), and the NAND output CC1 becomes active (i.e., "Low" level).

As a result, the Y-decode output CS0 from the Y-decoder/selector section 123 becomes inactive (i.e., "Low level), so that the Y-decode output CS1 remains active (i.e., "High" level), and the Y-decode output CS2 becomes active (i.e., "High" level).

At time t6, at which the last burst data in the address a is being output from the output circuit 20, the first and second data in the address a+1 has already been read and transferred to immediately before the selector 132c via the common bit lines CBITB0 and CBITB1. As a result, the data on the common bit lines CBITB0 and CBITB1 can be output from the output circuit 20 even in the first access occurring at time t7 (at which the output CSi from the Y-decoder/selector section 123 has switched), thereby continuing the high-speed read in the burst mode.

By incrementing the address signals A0 and A1 by 1, the data stored in the respective memory cells M, which have been read onto common bit lines CBITB0 to CBITB3 coupled to the selector 132c, is sequentially selected, amplified by sense amplifiers in the read circuit 33, and output at the output terminal 2 as the output Dout of the output circuit 20.

Concurrently at time t6, the Y-decode output CS2 becomes active (i.e., the "High" level) so that the memory cells M2i0 to M2i3 are selected, and the selected memory cells M2i0 to M2i3 are coupled to the common bit lines CBITA0 to CBITA3 via the row selection MOS transistors 3 in the Y-selector 123b.

At time t6 (at which the address signals A0 and A1 are shift to the "Low" level and the "Low" level, respectively), the output signal P1 of the burst mode decoder circuit 131 shifts to the "Low" level, and the precharge (1) circuits 124b begin precharging the common bit lines CBITA2 and CBITA3. Moreover, an operation begins to read the data stored in the memory cells M2i2 and M2i3 coupled to the common bit lines CBITB2 and CBITB3, which have already been precharged, to immediately before the selector 132c.

At time t8 (at which the address signals A0 and A1 are shift to the "Low" level and the "High" level, respectively), the output signal P0 of the burst mode decoder circuit 131 shifts to the "High" level, and the precharge (0) circuits 124a begin precharging the common bit lines CBITB0 and CBITB1. Moreover, an operation begins to read the data stored in the memory cells M2i0 and M2i1 coupled to the common bit lines CBITA0 and CBITA1, which have already been precharged, to immediately before the selector 132c.

Thus, addresses are sequentially designated by the address signals A2 to A19, and the burst data in the designated addresses are rapidly read.

Thus, at the time of selecting the memory cells M of the addresses designated by the input address signals A2 to A19, the Y-decoder/selector section 123 of the semiconductor memory device of the present invention concurrently precharges the common bit lines CBIT coupled to the memory cells in the next address in advance and reads the data stored in the memory cells M. As a result, once the reading of the burst data in the address designated by the input address signals A0 to A19 is complete, it is possible to immediately read the burst data in the next address.

Therefore, in accordance with the semiconductor memory device of the present example, it is possible to perform a continuous high-speed read operation without disruption even at the time of switching addresses when successively reading burst data. Thus, a higher-speed read operation can be provided than is possible with the aforementioned conventional examples.

Since the Y-decoder/selector section 123 of the semiconductor memory device of the present example selects the memory cells M corresponding to the column address designated by the input address signals A2 to A19 as well as other memory cells as mentioned above, the Y decoder 123a can be realized simply by adding one NAND circuit to the NAND circuits which are provided for the respective columns in the aforementioned conventional semiconductor memory devices. Accordingly, the continuous reading of burst data is realized without substantial increase in the chip area.

Although the above example illustrates a case where the present invention is applied to a non-volatile memory device, the invention is also readily applicable to the burst mode read in a volatile memory device such as a DRAM (dynamic random access memory).

As described above, in accordance with the semiconductor memory device of the present invention, a column selector is configured so as to select a plurality of columns of memory cells in a memory cell array corresponding to the column addresses designated by input address signals as well as a plurality of columns of memory cells correspond-ing to at least one column address other than the designated column addresses. As a result, in addition to reading the burst data corresponding to the column addresses designated by the input address signals, the burst data corresponding to the column addresses to be next selected can also be read and transferred to immediately before the selector.

As a result, when reading of the burst data in the address designated by the input address signals is complete and reading of the burst data in the next address begins, the burst data in the next address has already been read and transferred to the selector, which is disposed before a read circuit. Therefore, it is possible to perform a continuous high-speed read operation without disruption even at the time of switching addresses when successively reading burst data. Thus, a higher-speed read operation can be provided than is possible with the aforementioned conventional examples.

The column selector may be any circuit capable of selecting a plurality of columns in the memory cell array corresponding to the column addresses designated by input address signals as well as a plurality of columns of memory cells corresponding to at least one column address other than the designated column addresses. For example, such a circuit can be realized by additionally incorporating a logic circuit for each plurality of columns to be designated by column addresses in a usual column selector circuit.

Accordingly, the semiconductor memory device of the present invention can provide a continuous high-speed reading in a burst mode operation without substantial increase in the chip area.

The continuous high-speed read can be performed with improved stability especially by an arrangement such that the column selector simultaneously selects at least two groups of columns of memory cells to be accessed one after another, and, when access to an earlier one of the at least two groups begins, begins precharging bit lines associated with the columns of memory cells of a subsequent one of the at least two groups, and/or an arrangement such that a period for reading each group of columns of memory cells is prescribed to be shorter than a period for precharging the bit lines.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device comprising:

a memory cell array including a plurality of memory cells arranged in a matrix of rows and columns; and a row selector for selecting one of the rows of the memory cell array in accordance with an input address signal, the semiconductor memory device having a burst mode for sequentially accessing one row of memory cells, wherein the memory cell array comprises a plurality of groups each including at least one column of memory cells, and wherein the semiconductor memory device further comprises:

a column selector for simultaneously selecting all of the columns in each group in accordance with the input address signal; and at least two precharge circuits for precharging bit lines associated with the columns in each group selected by the column selector.

2. A semiconductor memory device according to claim 1, wherein the column selector simultaneously selects at least two groups of columns of memory cells to be accessed one after another, and, when access to an earlier one of the at least two groups begins, begins precharging bit lines associated with the columns of memory cells of a subsequent one of the at least two groups.

3. A semiconductor memory device according to claim 2, wherein, when access to a first one of the plurality of groups is completed, a subsequent one of the plurality of groups to be accessed is selected.

4. A semiconductor memory device according to claim 1, wherein a period for reading each group of columns of memory cells is prescribed to be shorter than a period for precharging the bit lines.

5. A semiconductor memory device comprising:

a memory cell array including a plurality of memory cells arranged in a matrix of rows and columns; and a row selector for selecting one of the rows of the memory cell array in accordance with an input address signal, the semiconductor memory device having a burst mode for sequentially accessing one row of memory cells, wherein the memory cell array comprises a plurality of groups each including at least one column of memory cells, the semiconductor memory device further comprising:

a selector for selecting at least two of the plurality of groups in accordance with the input address signal;

a precharging circuit for precharging bit lines associated with all of the columns in the at least two groups selected by the column selector; and an access circuit for accessing the at least two groups selected by the column selector and precharged by the precharging circuit, and wherein when the access circuit begins access to one of the at least two groups, the selector selects a next one of the at least two groups, and wherein a period for accessing each group of columns of memory cells by the access circuit is prescribed to be shorter than a period for precharging all bit lines associated with each group of columns of memory cells.

6. A semiconductor memory device according to claim 5, wherein the access circuit begins the access to the one of the at least two groups, the precharging circuit begins precharging all bit lines associated with the next one of the at least two groups.

* * * * *